(12) United States Patent
Oda

(10) Patent No.: US 7,608,866 B2
(45) Date of Patent: Oct. 27, 2009

(54) SOLID-STATE IMAGE SENSOR WITH MICRO-LENSES FOR ANTI-SHADING

(75) Inventor: Kazuya Oda, Asaka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/714,119

(22) Filed: Mar. 6, 2007

(65) Prior Publication Data
US 2007/0210345 A1 Sep. 13, 2007

(30) Foreign Application Priority Data
Mar. 8, 2006 (JP) ............................. 2006-062712

(51) Int. Cl.
*H01L 31/062* (2006.01)
(52) U.S. Cl. ..................... 257/232; 257/292; 257/294
(58) Field of Classification Search ................ 257/232, 257/292, 294
See application file for complete search history.

(56) References Cited
U.S. PATENT DOCUMENTS
5,238,856 A * 8/1993 Tokumitsu ................. 438/69

5,592,223 A * 1/1997 Takamura et al. ........... 348/309
6,221,687 B1 * 4/2001 Abramovich ................ 438/70
2006/0138498 A1 * 6/2006 Kim ........................... 257/294

FOREIGN PATENT DOCUMENTS
JP 4-298175 A 10/1992

* cited by examiner

*Primary Examiner*—Douglas M Menz
(74) *Attorney, Agent, or Firm*—Birch, Stewart, Kolasch & Birch, LLP

(57) ABSTRACT

A solid-state image sensor prevents shading while maintaining the wider dynamic range of an image signal without reducing its optical resolution. The image sensor has plural pairs of higher- and lower-sensitivity photodiodes and micro-lenses each of which is provided over particular one of the higher- and lower-sensitivity photodiodes for collecting the light incident on corresponding one of the higher- and lower-sensitivity photodiodes. The micro-lenses provided over the lower-sensitivity photodiodes have the curvature thereof smaller than that of the other micro-lenses, thereby providing for the lower-sensitivity photodiode a significant amount of light even for a change of the exit pupil position or incident angle or the like that causes the position of an image circle to shift.

18 Claims, 8 Drawing Sheets

SOLID-STATE IMAGE SENSOR WITH MICRO-LENSES FOR ANTI-SHADING

BACKGROUND OF THE INVENTION

1. Field of the Invention

The present invention relates to a solid-state image sensor, and more particularly to a solid-state image sensor comprising photodiodes each of which has a micro-lens arranged thereover.

2. Description of the Background Art

Some conventional solid-state image sensors provide the wider dynamic range of an image signal representative of a scene captured while retaining, or without reducing, the photo-sensitivity of photodiodes or photosensitive cells. For example, in the solid-state image sensor disclosed in Japanese Patent Laid-Open Publication No. 298175/1992, hereinafter referred to as Document 1, two types of horizontal lines of photodiodes are arranged alternately in the vertical direction. Specifically, one type of horizontal line contains higher-sensitivity photodiodes and the other contains lower-sensitivity photodiodes. Then, every two photodiodes, vertically adjacent to each other, of different sensitivities work together as one pixel. Signal charges obtained from the two photodiodes separately from each other are added up to each other to form a signal charge of one pixel, which attains a wider dynamic range.

Where one pixel is composed of a couple of photodiodes of different sensitivities as disclosed in Document 1, problems such as lowering the sensitivity of the photosensitive cells and shading may likely occur depending upon, e.g. changing the exit pupil position of an imaging lens or the incidence angle of an imagewise light beam.

The problems are due to the lower-sensitivity photodiodes. Specifically, because of the lower-sensitivity photodiodes or the opening of the optical shielding film being smaller in area, a change of the exit pupil position or the incident angle may extremely reduce the amount of light incident on the lower-sensitivity photodiodes, thereby lowering the sensitivity of the photosensitive cells and causing shading.

SUMMARY OF THE INVENTION

It is an object of the present invention to provide a solid-state image sensor in which two types of photodiodes form one pixel with the shading minimized without lowering the sensitivity of the photosensitive cells while maintaining the wide dynamic range of an image signal.

In accordance with the present invention, a solid-state image sensor for anti-shading includes a plurality of micro-lenses each being allocated to particular one of lower-sensitivity photodiodes, each of the micro-lenses having its curvature smaller than that of the micro-lenses assigned to particular one of the higher-sensitivity photodiodes or substantially equal to zero. The solid-state image sensor of the present invention also comprises a plurality of in-layer lenses each being provided between particular one of the micro-lenses and particular one of the lower-sensitivity photodiodes, the micro-lenses having the curvature thereof also smaller than that of the in-layer lens provided between the particular micro-lens and the higher-sensitivity photodiode, or substantially equal to zero.

Also the solid-state image sensor of the present invention includes a substantially flat element provided on the array of micro-lenses to avoid a possibility in which the micro-lenses of different shapes provided for the higher- and lower-sensitivity photodiodes may cause, during the dicing process, cuttings to be caught in a space between projections of the micro-lenses.

In accordance with the present invention, the micro-lenses on the lower-sensitivity photodiodes have the curvature thereof small or substantially equal to zero, thereby a significant amount of light being provided for the lower-sensitivity photodiodes. The solid-state image sensor of the present invention is thus free from a difference in the amount of the incident light between the lower-sensitivity photodiodes, thereby preventing the optical sensitivity from being reduced or shading from being caused. In the present invention, it is also possible to prevent a foreign material from being caught in a space between the micro-lenses.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
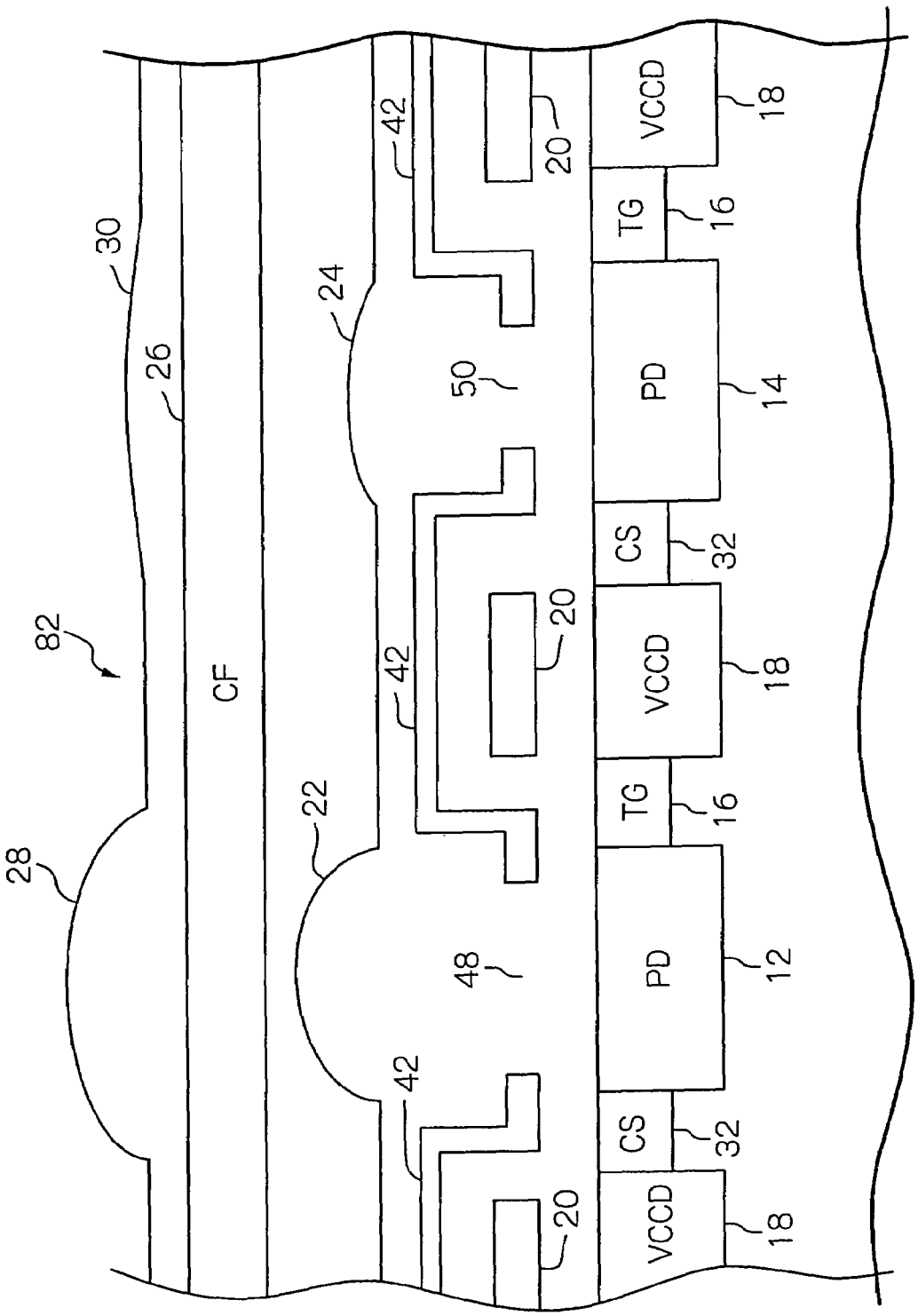
FIG. 1 is a schematic cross-sectional view of part of an array of photodiodes taken along a straight line I shown in FIG. 2.

Next, with reference to the accompanying drawings, preferred embodiments of the solid-state image sensor according to the present invention will be described in detail. FIG. 1 schematically shows a cross-section of an array of photodiodes taken along a straight line I shown in FIG. 2 which shows, in a top plain view, part of the array of photodiodes of an embodiment of a solid-state image sensor according to the present invention.

Figure 2:
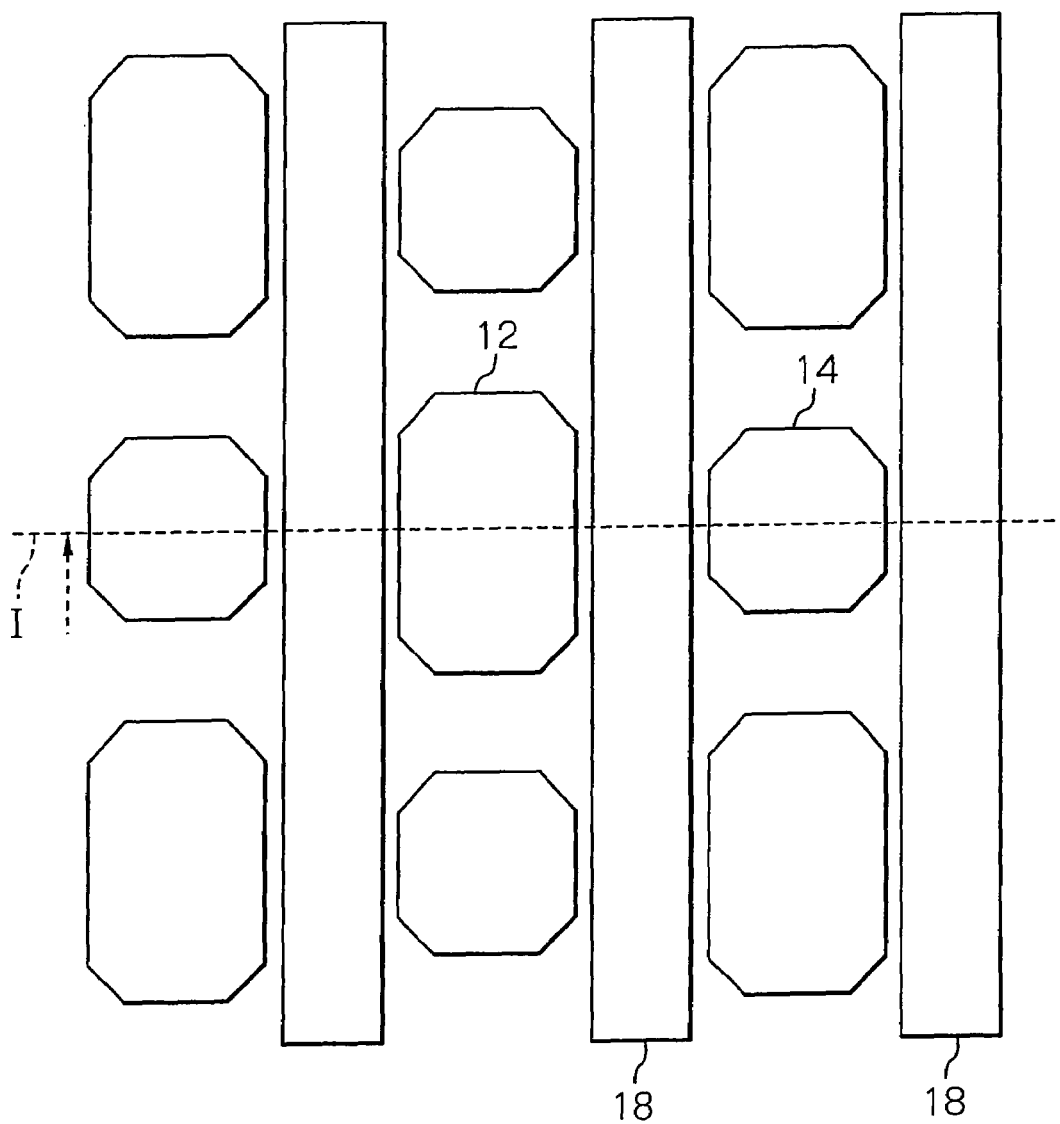
FIG. 2 is a top plan view schematically showing part of the array of photodiodes of an embodiment of a solid-state image sensor according to the present invention.

In FIGS. 1 and 2, the solid-state image sensor 10, which may be implemented by a charge-coupled device (CCD), includes a great number of higher- and lower-sensitivity photodiodes or photosensors 12 and 14, labeled PDs in FIG. 1, transfer gates 16, labeled TGs in FIG. 1, vertical transfer paths 18, labeled VCCDs in FIG. 1, transfer electrodes 20, in-layer lenses 22 and 24, red (R), green (G) and blue (B) color filter 26, labeled CF in FIG. 1, top micro-lenses 28 and 30, and channel stops 32, labeled CSs in FIG. 1, which are arranged as illustrated to cooperatively function as converting the optical image of an imaging field to corresponding analog electric signals. In the figures, elements not directly relevant to understanding the present invention are not shown, and detailed description thereof will not be made in order to avoid complexity.

In the solid-state image sensor 10, the higher- and lower-sensitivity photodiodes 12 and 14 are adjacently arranged in a bidimensional matrix to form an image sensing surface or photosensitive cell array. These two types of photodiodes in couple form one pixel.

Figure 3:
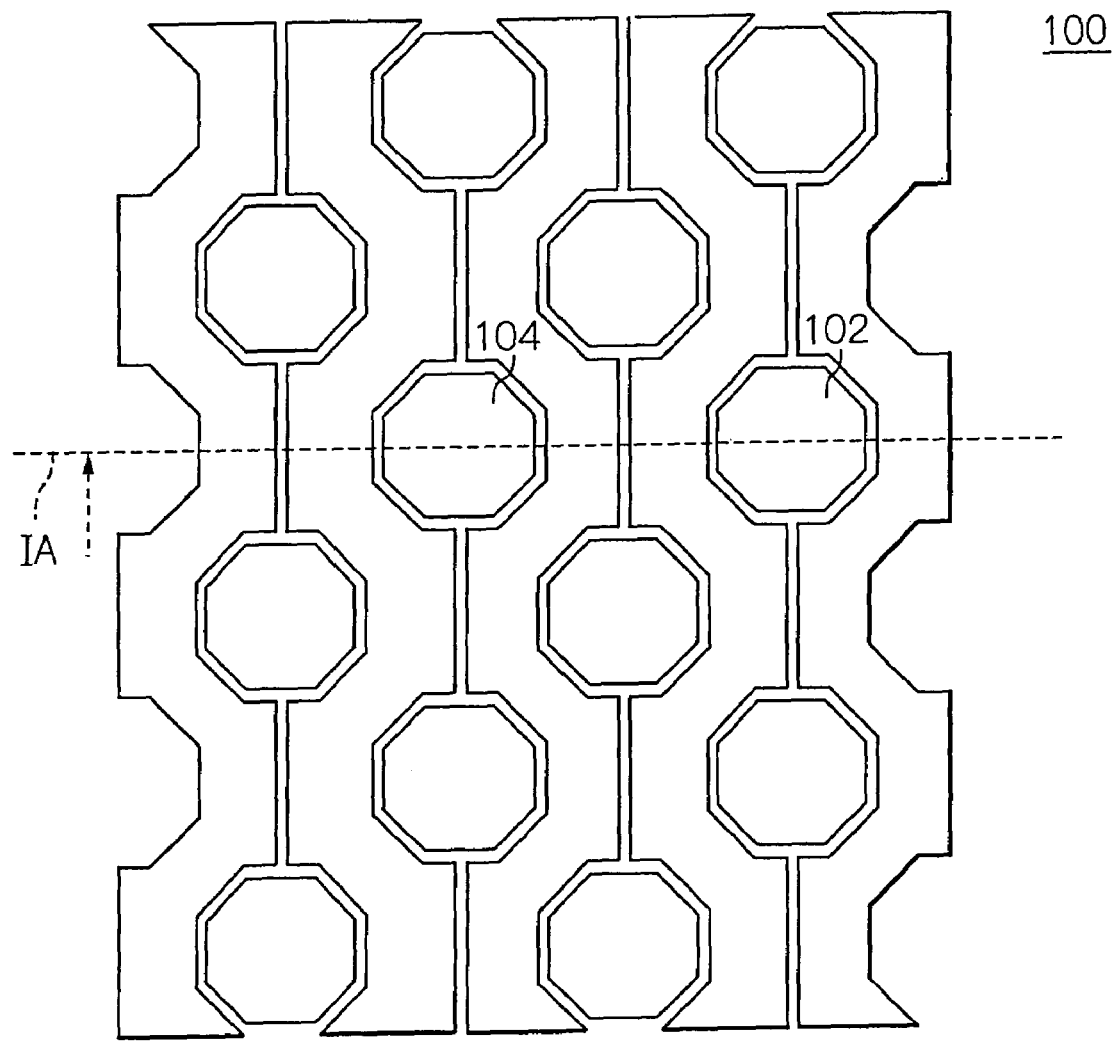
FIG. 3 is a top plan view, like FIG. 2, schematically showing part of the array of photodiodes of an alternative embodiment of a solid-state image sensor according to the present invention.

Note that although in this illustrative embodiment, as shown in FIG. 2, the solid-state image sensor 10 includes two types of photodiodes which are different in size, the present invention is not limited to such a specific form, but may be applied to, e.g. a solid-state image sensor 100 having the same size of the higher- and lower-sensitivity photodiodes 102 and 104, as shown in FIG. 3. The solid-state image sensor 100 has the same cross section of an array of photodiodes taken along the straight line IA shown in FIG. 3 as what is shown in FIG. 1.

Referring again to FIG. 1, each of the higher- and lower sensitivity photodiodes 12 and 14 is adapted to generate a particular signal charge corresponding to an amount of incident light from an imaging field to be captured. The signal charges are then transferred via the transfer gate 16, each of which is arranged to control the read-out of signal charges generated in the photodiodes, to the vertical transfer paths 18 where the signal charges read out from the photodiodes are transferred in the vertical direction to a horizontal transfer path which is not shown. In FIG. 1, provided on a side of the vertical transfer paths 18 opposite to a side where the transfer gate 16 resides is the channel stop 32, which is adapted to prevent the signal charges from being transferred to a side of the vertical transfer paths 18 where the transfer gate 16 does not reside.

In FIG. 1, each of the higher- and lower-sensitivity photodiodes 12 and 14 has a optical shielding film 42 formed thereover. The optical shielding films 42 are arranged to prevent the vertical transfer paths 18 from being exposed to light, and also, in the illustrative embodiment, provide different sized optical openings 48 and 50 for each of the higher- and lower-sensitivity photodiodes 12 and 14, thereby rendering different sensitivities to them. Specifically, for each of the higher-sensitivity photodiode 12, the optical shielding film 42 covers a smaller portion of the photodiode 12 to provide a larger opening 48, and for each of the lower-sensitivity photodiode 14, the optical shielding film 42 covers a larger portion of the photodiode 14 to provide a smaller opening 50, thereby allowing the openings 48 and 50 of different sizes to provide different sensitivities from each other.

Note that the present invention is not limited to the embodiment described above, but may use other known methods to form, in the photosensitive array, two types of photodiodes in different sensitivities. The higher- and lower-sensitivity photodiodes may be established by a couple of photodiodes different, for example, in size, in exposure period of time or in optical transmittance from each other. Note that the present invention is not limited to those specifically described above.

In FIG. 1, over the optical shielding film 42, provided are in-layer lenses 22 and 24. Over the in-layer lenses 22 and 24, the color filter 26 is provided, over which the top micro-lenses 28 and 30 are provided. Note that, the photodiodes, transfer gates, vertical transfer paths, channel stops, optical shielding film, transfer electrodes and color filter may be conventional and will not be described specifically.

The top micro-lenses 28 and 30 function as collecting or condensing the incident light that is incident via an optical lens, not shown, on the solid-state image sensor 10. The top micro-lenses 28 and 30 then pass the collected light, via the color filter 26, to the in-layer lenses 22 and 24. The in-layer lenses 22 and 24, like top micro-lens, function as further collecting the light collected by the top micro-lenses 28 and 30 and pass the light to the higher- and lower-sensitivity photodiodes 12 and 14, respectively. More specifically, in higher-sensitivity photodiode 12, the top micro-lens 28 collects the incident light and then passes the collected light via the color filter 26 to the in-layer lens 22 where the light is further collected and passed to the photodiode 12. Similarly, in the lower-sensitivity photodiode 14, the top micro-lens 30 collects the incident light and then passes the collected light via the color filter 26 to the in-layer lens 24 where the light is further collected and passed to the photodiode 14.

Note that, the in-layer lens 22 and top micro-lens 28 in the higher-sensitivity photodiode 12 may be conventional and are not limited thereto. Although, in the illustrative embodiment, the in-layer lens 22 is a lens convex toward the light-incident side, it may be of any other suitable type. For example, the in-layer lens 22 may alternatively be a lens convex toward a side opposite to the light-incident side, i.e. the photodiode 12 side, or toward both of the light-incident side and photodiode 12 side.

Figure 4:
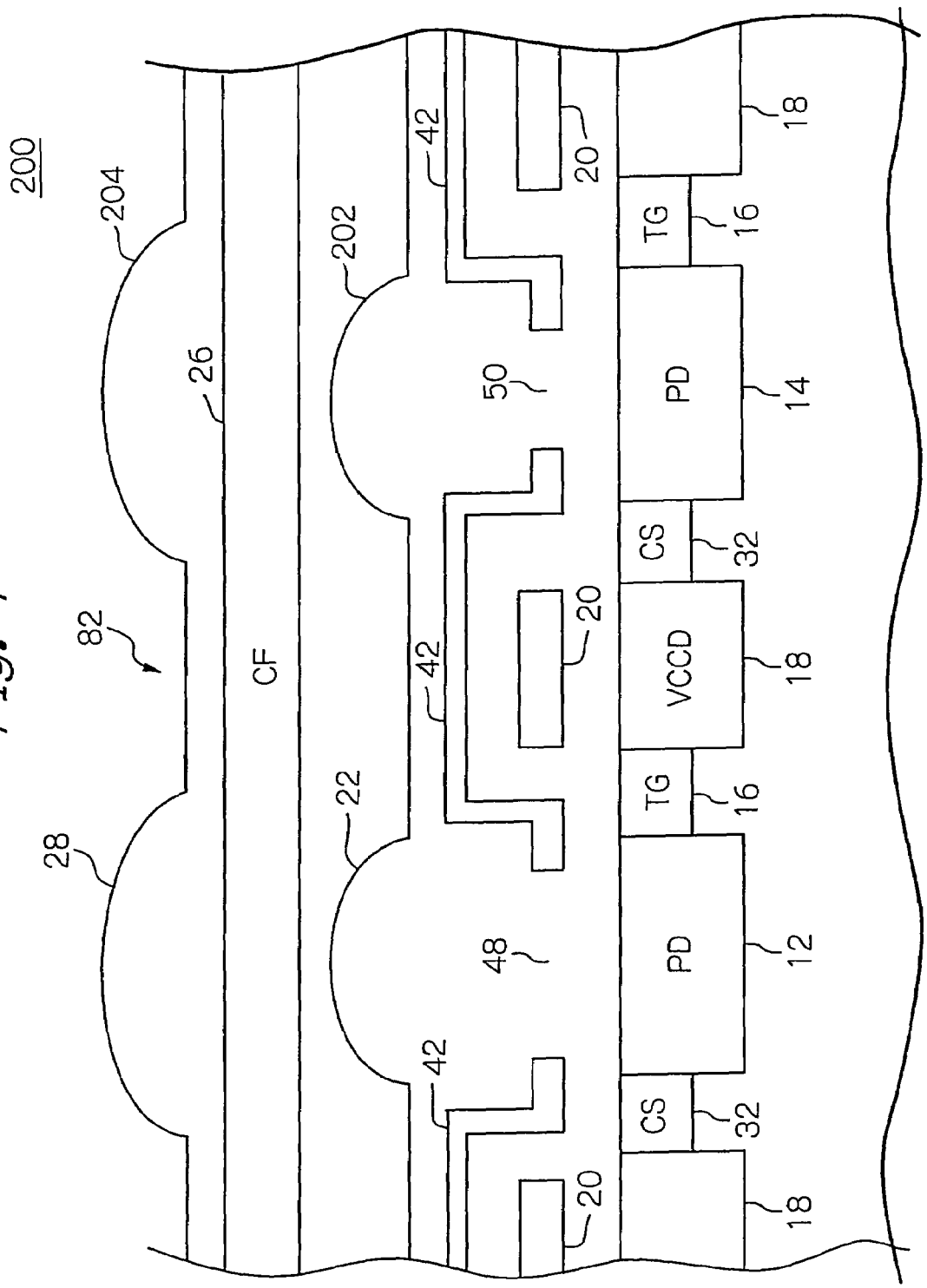
FIG. 4 is schematic cross-sectional view of part of an array of photodiodes of a conventional solid-state image sensor to be compared with the solid-state image sensor according to the present invention.

Prior to describing the in-layer lens 24 and top micro-lens 30 in accordance with the invention, reference will be made to FIGS. 4 and 5, for describing a fluctuation in the amount of the incident light due to a change of an exit pupil position or incident angle in the lower-sensitivity photodiodes. FIG. 4 shows schematically, in a cross-sectional view, part of an array of photodiodes of a conventional solid-state image sensor to be compared with the solid-state image sensor according to the present invention. In FIG. 4, structural parts and elements like those shown in FIG. 1 are designated by identical reference numerals, and in-layer lens 202 and top micro-lens 204 are also like the top micro-lens 28 and in-layer lens 22, respectively, and will not be described specifically in order to avoid redundancy.

Figure 5:
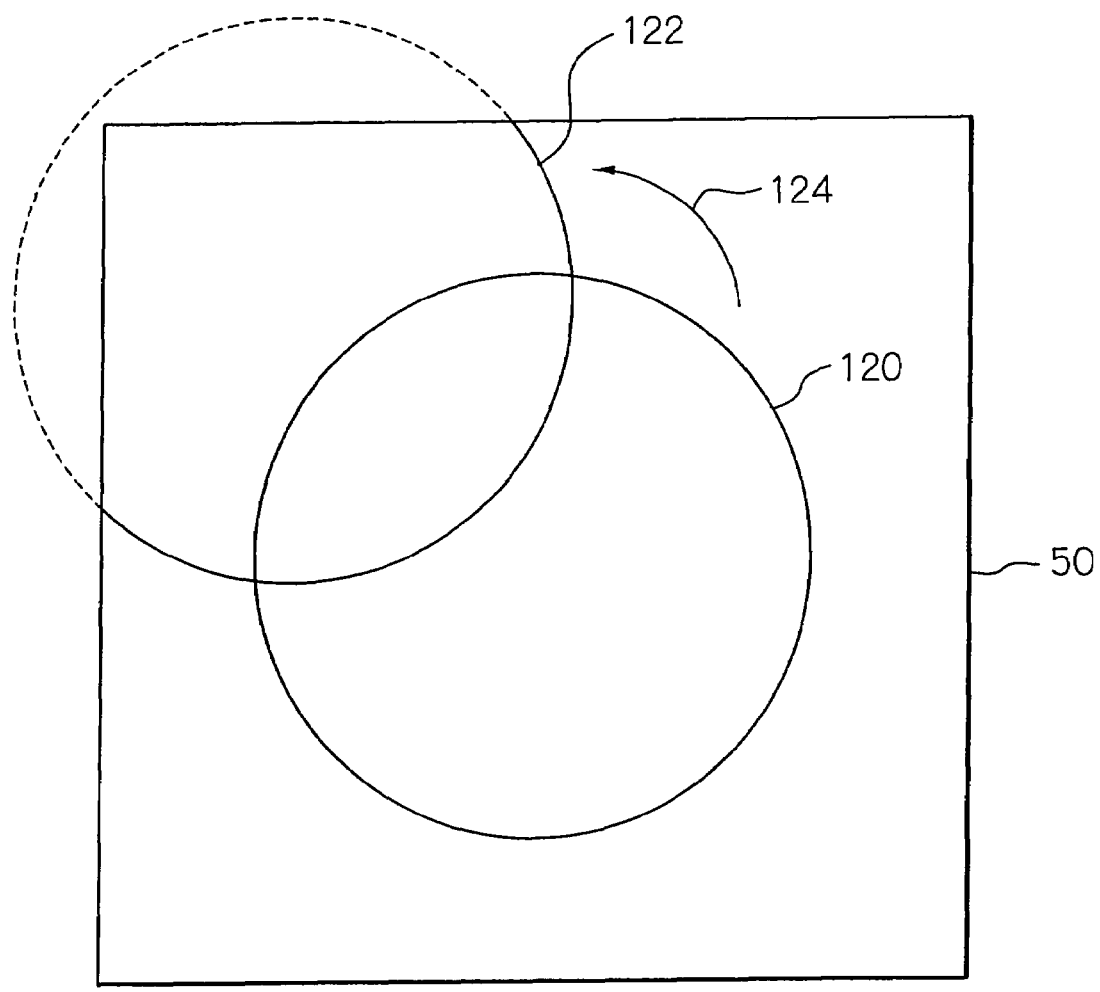
FIG. 5 schematically illustrates an example of an image circle formed in a lower-sensitivity photodiode in the array of photodiodes of a conventional solid-state image sensor shown in FIG. 4.

In the conventional solid-state image sensor 200, FIG. 4, the in-layer lens 202 and top micro-lens 204 in the lower-sensitivity photodiode 14 have the spherical curvature, i.e. the curvature of the convexity or concavity, thereof substantially equal to that of the in-layer lens 22 and top micro-lens 28 disposed for the higher-sensitivity photodiode 12, respectively, so that the top micro-lens 204 and in-layer lens 202 make the incident light thin whereby the lower-sensitivity photodiode 14 is provided with a smaller image circle 120 formed by the collected incident light, as shown in FIG. 5. The opening 50 is, however, smaller than the opening 48 as shown in FIG. 4, so that the smaller image circle 120 is subject to a change of the exit pupil position or incident angle.

Specifically, because of the smaller opening 50 as well as the smaller image circle 120, for example, light incident obliquely due to the change of the exit pupil position or incident angle or the like forms an image circle 122 which is shifted from the opening 50 as shown by the arrow 124 in FIG. 5. The lower-sensitivity photodiode 14 is thus partially irradiated with the incident light, thus lowering the sensitivity of the photosensitive cells and causing shading.

The solid-state image sensor 10 according to the present invention, however, includes the in-layer lens 24 and top micro-lens 30 that have, respectively, smaller curvatures than the in-layer lens 22 and top micro-lens 28 of the higher-sensitivity photodiode 12 or substantially zero curvatures, as shown in FIG. 1, thereby providing the larger image circle 60 for the lower-sensitivity photodiode 14. The solid-state image sensor 10 is thus less affected by the change of the exit pupil position, incident angle or the like, thereby preventing the sensitivity reduction or the brightness or color shading or the like. A more detailed description will be given below.

Figure 6:
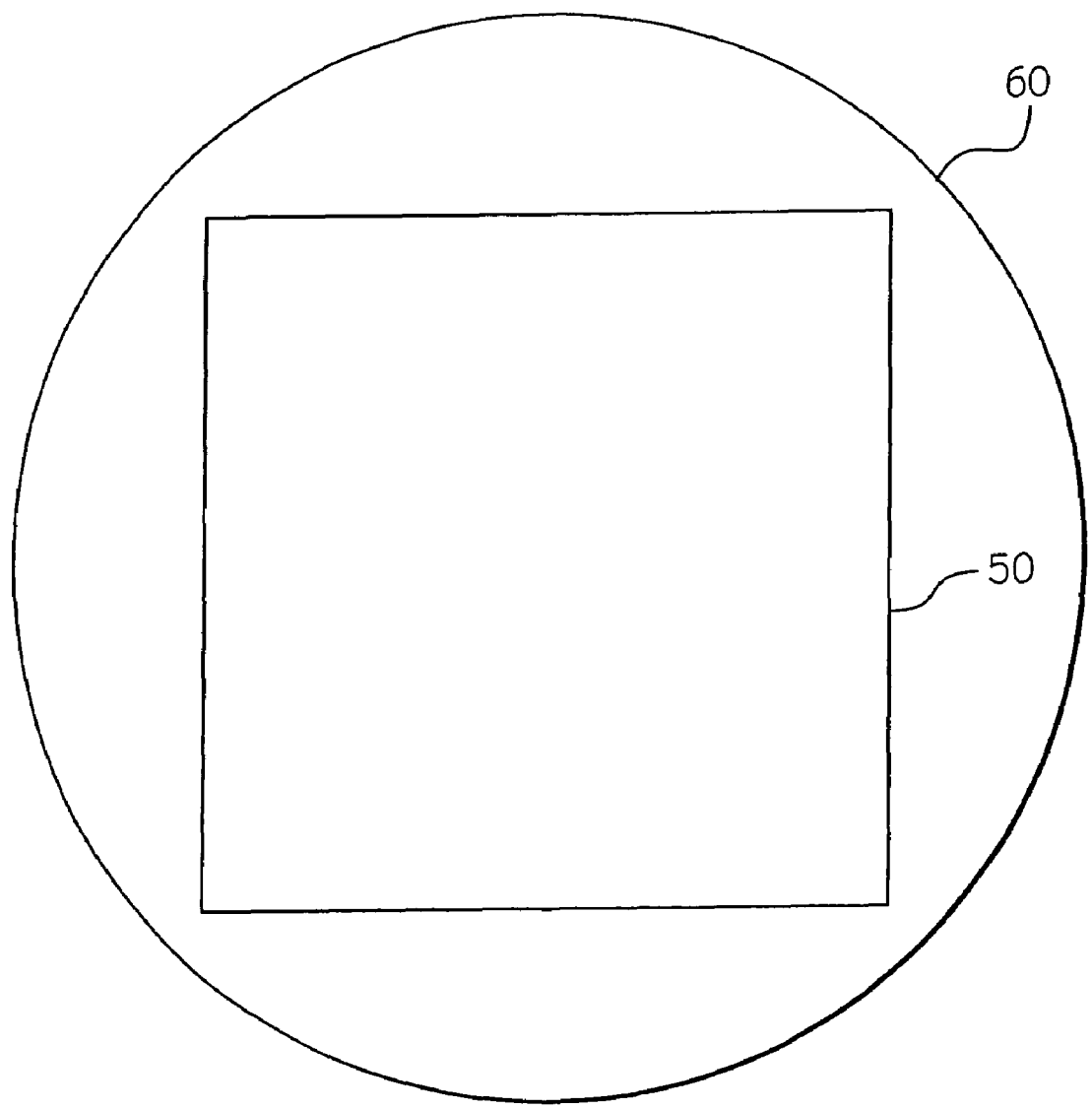
FIG. 6 schematically illustrates, like FIG. 5, an example of an image circle formed in a lower-sensitivity photodiode in the array of photodiodes of a solid-state image sensor shown in FIG. 1.

In FIG. 1, the in-layer lens 24 and top micro-lens 30 have the curvature thereof smaller than the in-layer lens 22 and top micro-lens 28 of the higher-sensitivity photodiode 12, respectively. The in-layer lens 24 and top micro-lens 30 thus hardly collecting the incident light, thereby providing a larger image circle 60 than the conventional solid-state image sensor, as shown in FIG. 6. Although the solid-state image sensor 10, in the illustrative embodiment, includes the top micro-lenses 28 and 30 and the in-layer lenses 22 and 24, the solid-state image sensor 10 may be adapted to include top micro-lenses 28 and 30 only, and, even in that case, the top micro-lens 30 needs to have its curvature smaller or substantially equal to zero to provide the larger image circle for the lower-sensitivity photodiodes 14.

How much smaller curvature the in-layer lens 24 and top micro-lens 30 have may be determined to any value depending on the size of the opening 50 or the sensitivity difference between the higher- and lower-sensitivity photodiodes 12 and 14. In the illustrative embodiment, the curvatures of the in-layer lens 24 and top micro-lens 30 are determined such that the solid-state image sensor 10 maintain its sensitivity ratio between the higher- and lower-sensitivity photodiodes 12 and 14 equal to 16 to 1 and the image circle 60 has its periphery outside the opening 50, in other words, the lower-sensitivity photodiodes 14 are completely exposed to the incident light, for example.

Note that, the curvatures of the in-layer lens 24 and top micro-lens 30 are not limitative, but only illustrative and any value may be used that allows the lower-sensitivity photodiodes 14 to be exposed to at least a certain amount of light even for a change of the exit pupil position or incident angle or the like that shifts the position of the image circle. For example, the curvatures may be determined such that, the width or diagonal length of the opening 50 equals the diameter of the image circle 60. The curvatures may also be equal to substantially zero (or one/infinity), i.e. the light collection ratio is substantially equal to unity, thereby in-layer lens 24 and top micro-lens 30 directly passing the incident light from the optical lens to the lower-sensitivity photodiode 14. In order to achieve substantially zero curvature, the solid-state image sensor in the invention may have the lower-sensitivity photodiodes 14 provided with noting for collecting the incident light, for example. Note that the present invention is not limited to those specific examples.

As described above, the solid-state image sensor 10 according to the present invention includes the in-layer lens 24 and top micro-lens 30 of a smaller curvature, thereby making it possible to provide the larger image circle 60 for the lower-sensitivity photodiodes 14. It is thus possible to provide a certain amount of light for the lower-sensitivity photodiodes 14 even when the exit pupil position or incident angle changes, by which it is possible to prevent the sensitivity reduction or shading generation or the like.

Note that, in an application where the curvatures of the in-layer lens 24 and top micro-lens 30 are modified so as to widen the image circle provided for the lower sensitivity photodiode 14, as in the instant embodiment, the sensitivity ratio between higher- and lower-sensitivity photodiodes 12 and 14 can be adjusted by, for example, adjusting the sizes of the respective openings 48 and 50, or differentiating the exposure time or the optical transmittance therebetween.

Figure 7A:
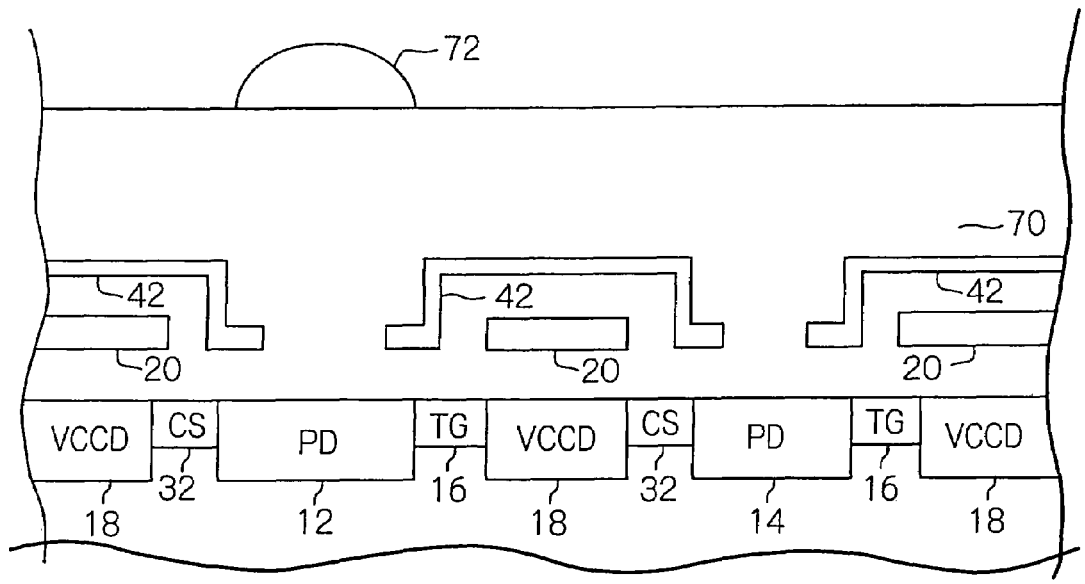
FIGS. 7A and 7B schematically illustrate an exemplified way of fabricating in-layer lenses in the illustrative embodiment.
Figure 7B:
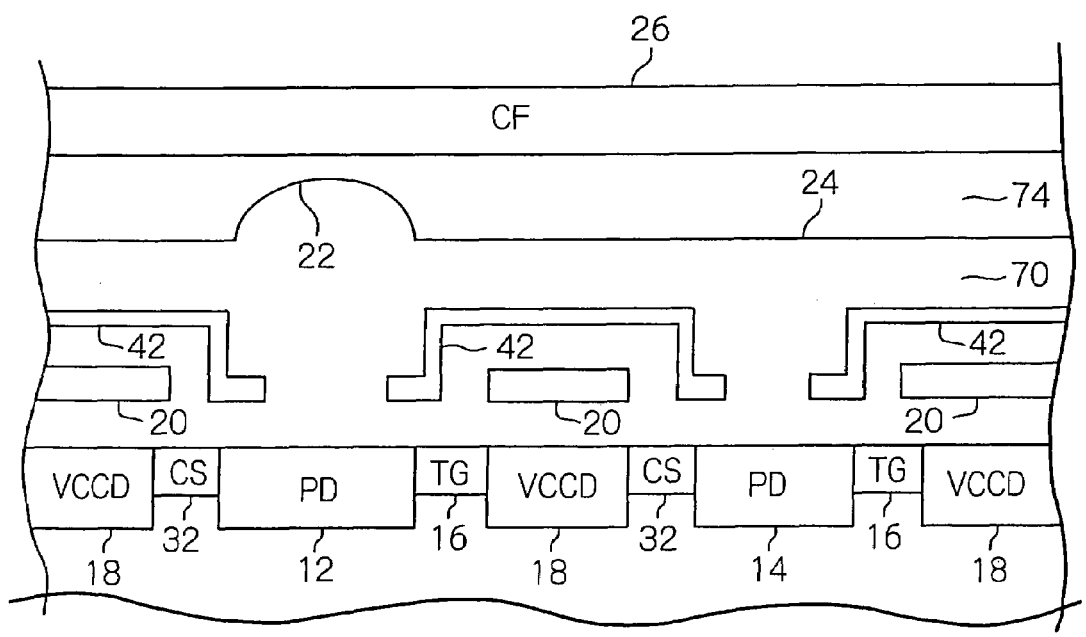

Reference will be made to FIGS. 7A and 7B for describing a process of forming the in-layer lenses shown in FIG. 1. In FIGS. 7A and 7B, structural parts and elements like those shown in FIG. 1 are designated by identical reference numerals, and will not be described specifically in order to avoid redundancy. As shown in FIGS. 7A and 7B, even when different curvatures are used for the in-layer lenses 22 and 24 and for the top micro-lenses 28 and 30, they are formed by a well-known method of fabricating the in-layer lenses and top micro-lenses. Note that, FIGS. 7A and 7B show an example where the in-layer lens 24 has its curvature substantially equal to zero.

In FIG. 7A, in order to form the in-layer lens 22 convex toward the light-incident side for the higher-sensitivity photodiode 12, a photo-resist 72 is formed in a predetermined position on a plasma nitride film 70 on the optical shielding film 42. On the other hand, for the lower-sensitivity photodiodes 14, in order to form the in-layer lens 24 having substantially zero curvature, no resist is formed.

After the resist 72 is formed only for the higher-sensitivity photodiode 12 as described above, the entire structure with the resist is etched and the resist is then removed, thereby the in-layer lens 22 of silicon nitride film being formed only for the higher-sensitivity photodiode 12, as shown in FIG. 7B. Also, the in-layer lens 24 is not formed for the lower-sensitivity photodiode 14, thereby providing a substantially zero curvature for the in-layer lens 24. Note that the present invention is not limited to the specific embodiment described above. The in-layer lens 24 may also be formed to have a smaller curvature than the in-layer lens 22 by, for example, forming the resist 72 of a different shape.

After the in-layer lenses 22 and 24 are formed as described above, the convex surface of the in-layer lens 22 is then planarized, or made flat, by forming on the in-layer lenses 22 and 24 a planarizing film 74 on which a color filter 26 is then fabricated, as shown in FIG. 7B. Note that, although not shown, the color filter 26 has an additional planarizing film formed thereon for the top micro-lenses. The micro-lenses, which also have different curvatures in the higher- and lower-sensitivity photodiodes 12 and 14, may also be formed by any known methods.

Figure 8:
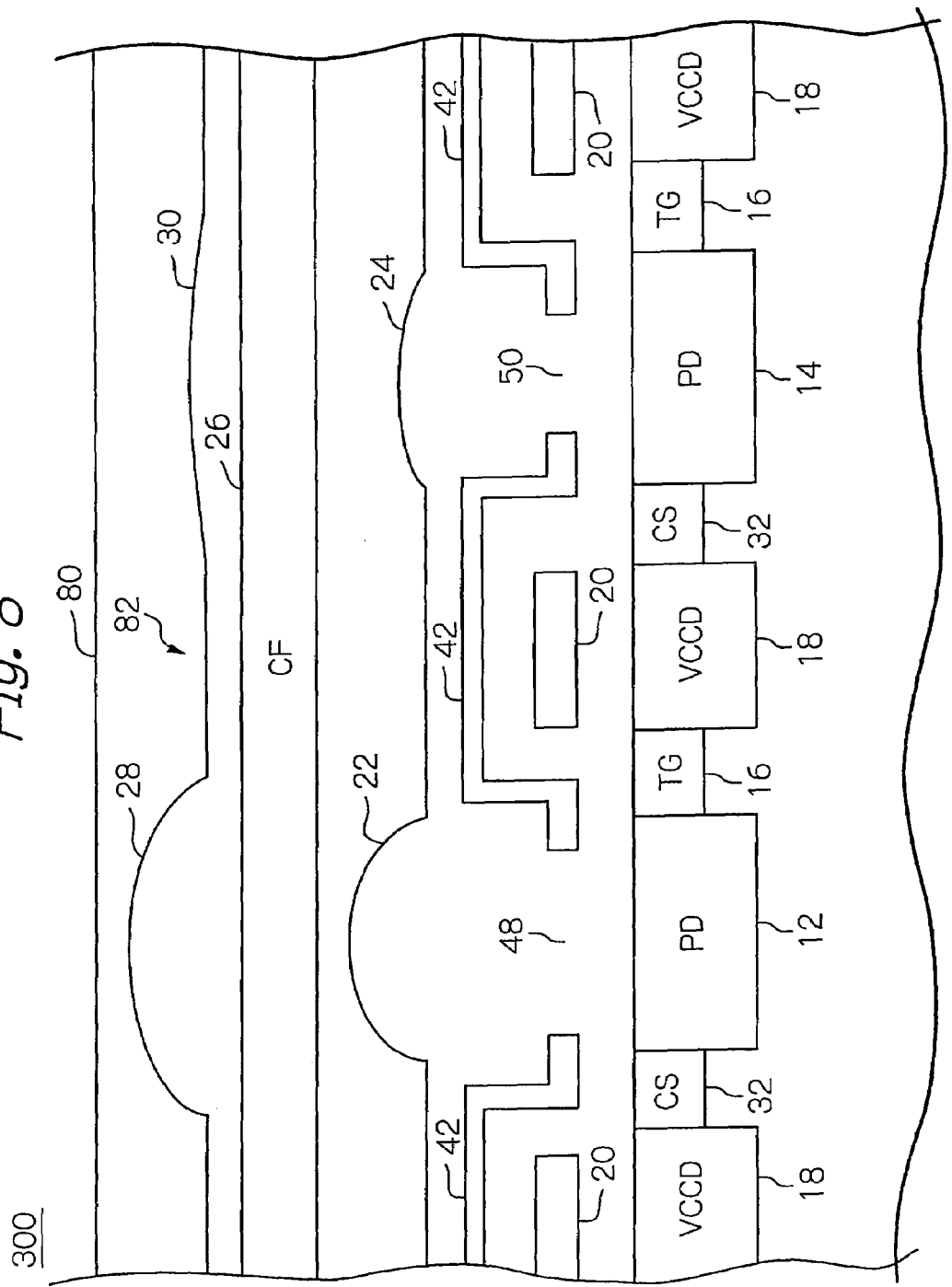
FIG. 8 is another schematic cross-sectional view of, like FIG. 1, part of the array of photodiodes taken along a straight line I shown in FIG. 2.

Reference will be made to FIG. 8 for describing an alternative, specific solid-state image sensor according to the present invention. FIG. 8 is another schematic cross-sectional view of, like FIG. 1, the array of photodiodes taken along the straight line I shown in FIG. 2. In FIG. 8, structural parts and elements like those shown in FIG. 1 are designated by identical reference numerals, and will not be described specifically in order to avoid redundancy.

Briefly, in FIG. 8, the solid-state image sensor 300 includes a planarizing film 80 which is provided on the top micro-lenses 28 and 30 to planarize, i.e. complement, the convex surface of those lenses so as to prevent a foreign material from being caught in a space 82 between the projections, or convexities, of the top micro-lenses 28 and 30.

More specifically, in the solid-state image sensor in the present invention, the top micro-lenses 28 and 30 have different curvature, respectively, to allow the lower-sensitivity photodiode 14 to be provided with the larger image circle 60 while maintaining the sensitivity ratio. The top micro-lenses 28 and 30 of different curvature may, however, allow cuttings to be caught in the space 82 between the projections of the adjacent top micro-lenses 28 and 30 in a dicing process, which is one of the manufacturing processes for the solid-state image sensor 10. In this embodiment, the solid-state image sensor of the invention is then provided, before the dicing process, with the planarizing film 80 for covering the entire area of the top micro-lenses 28 and 30 to complement the convex surfaces of the top micro-lenses 28 and 30. It is thus possible to prevent the cuttings from being caught in the space 82 between the projections of the top micro-lenses 28 and 30. A more detailed description will be given below.

In FIG. 8, the planarizing film 80 has its refractive index lower than the top micro-lenses 28 and 30 and is substantially transparent and planar. The planarizing film 80 is also provided on the convex surface side of the top micro-lenses 28 and 30 to cover the top micro-lenses 28 and 30, thereby serving to prevent a foreign material e.g. cuttings from being caught in the space 82 between the projections of the adjacent top micro-lenses 28 and 30. Note that the process of providing the planarizing film 80 is, among the manufacturing processes for the solid-state image sensor 10, a process after the process of providing the top micro-lenses 28 and 30 and before the dicing process. The planarizing film 80 may be formed of any material that has a lower refractive index than the top micro-lens and is able to be made substantially transparent and planar. For example, the planarizing film 80 may be formed of the same material as the planarizing film 74 shown in FIGS. 7A and 7B, but not limited to.

The entire disclosure of Japanese patent application No. 2006-062712 filed on Mar. 8, 2006, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state image sensor comprising:
   a plurality of first photodiodes and a plurality of second photodiodes of sensitivity lower than said first photodiodes which are disposed in a virtual plane for receiving light incident from a field of view to be captured;
   a plurality of first micro-lenses each being provided over particular one of said first photodiodes for collecting the light incident on said particular first photodiode;
   a plurality of second micro-lenses each being provided over particular one of said second photodiodes for collecting the light incident on said particular second photodiode, at least one of said second micro-lenses having a curvature smaller than that of said first micro-lenses; and
   an optical shielding film having first openings located above said first photodiodes and second openings located above said second photodiodes associated with said second micro-lenses, one of said second openings being smaller than one of said first openings and said smaller curvature second micro-lens being located over said smaller second opening;
   a plurality of first in-layer lenses each being provided between one of said first openings and corresponding one of said first micro-lenses for further collecting the light collected by said first micro-lens on said first photodiode; and
   a plurality of second in-layer lenses each being provided between corresponding one of said second openings and corresponding one of said second micro-lenses for further collecting the light collected by said second micro-lens on said second photodiode, at least one of said second in-layer lenses having a curvature smaller than the curvature of one of said first in-layer lenses,
   wherein said curvature of said second micro-lens is smaller by an amount determined based on a size of said second opening.

2. The solid-state image sensor in accordance with claim 1, wherein at least one of said second micro-lenses has substantially zero curvature.

3. The solid-state image sensor in accordance with claim 1, further comprising a covering element provided over said first and second micro-lenses for preventing a foreign material from being caught in a space between adjacent ones of said first and second micro-lenses.

4. The solid-state image sensor in accordance with claim 3, wherein said covering element has a refractive index lower than said first and second micro-lenses, and is optically substantially transparent and planar.

5. The solid-state image sensor in accordance with claim 3, wherein said covering element is a film for planarizing the convex or concave of said first and second micro-lenses.

6. The solid-state image sensor in accordance with claim 1, wherein said at least one second in-layer lens has substantially zero curvature.

7. The solid-state image sensor in accordance with claim 1, wherein said optical shielding film provides different sized optical openings for said first photodiodes as compared to said second photodiodes.

8. The solid-state image sensor in accordance with claim 1, wherein said at least one of said second micro-lenses has said curvature smaller than the curvature of said one of said first micro-lenses, thereby providing a larger image circle for said second photodiode.

9. The solid-state image sensor in accordance with claim 1, wherein an amount by which said curvature is smaller is determined based on a sensitivity difference between said first and said second photodiodes.

10. The solid-state image sensor in accordance with claim 1, wherein an amount by which said curvature is smaller is determined such that said image sensor maintains a sensitivity ratio between said first and said second photodiodes.

11. The solid-state image sensor in accordance with claim 1, wherein an amount by which said curvature is smaller is determined such that said image sensor maintains a sensitivity ratio between said first and said second photodiodes equal to 16 to 1.

12. The solid-state image sensor in accordance with claim 1, wherein an amount by which said curvature is smaller is determined such that an image circle formed by collected incident light for said second photodiode has its periphery outside said opening.

13. A solid-state image sensor comprising:
   a plurality of first photodiodes and a plurality of second photodiodes of sensitivity lower than said first photodiodes which are disposed in a virtual plane for receiving light incident from a field of view to be captured;
   a plurality of first micro-lenses each being provided over particular one of said first photodiodes for collecting the light incident on said particular first photodiode;
   a plurality of second micro-lenses each being provided over particular one of said second photodiodes for collecting the light incident on said particular second photodiode;
   an optical shielding film having first openings located above said first photodiodes and second openings located above said second photodiodes associated with said second micro-lenses, one of said second openings being smaller than one of said first openings;

a plurality of first in-layer lenses each being provided between corresponding one of said first openings and corresponding one of said first micro-lenses for further collecting the light collected by said first micro-lens on said first photodiode; and a plurality of second in-layer lenses each being provided between corresponding one of said second openings and corresponding one of said second micro-lenses for further collecting the light collected by said second micro-lens on said second photodiode, wherein at least one of said second micro-lenses and said second in-layer lenses have a curvature smaller than that of said first micro-lenses, and said smaller curvature second micro-lens is located over said smaller second opening, to allow one of said second photodiodes to be provided with a larger image area so that said image sensor is less affected by a change of an exit pupil position or an incident angle of a light beam, wherein an amount by which said curvature is smaller is determined such that an image circle formed by collected incident light for said second photodiode has its periphery outside said optical shielding film opening located above said second photodiode.

14. The solid-state image sensor in accordance with claim 13, wherein said curvature of said at least one of said second micro-lenses has a value that allows said one of said second photodiodes to be exposed to at least a certain amount of light even for a change of said exit pupil position or incident angle that shifts the position of an image area formed by collected incident light for said one of said second photodiodes.

15. The solid-state image sensor in accordance with claim 13, wherein said curvature of said at least one of said second micro-lenses is modified so as to widen said image area provided for said one of said second photodiodes, and the sensitivity ratio between said first and said second photodiodes is adjusted by adjusting sizes of respective openings created above said photodiodes in optical shielding films, or by differentiating an exposure time or an optical transmittance associated with respective photodiodes.

16. A solid-state image sensor comprising:

a first photodiode and a second photodiode of sensitivity lower than said first photodiode which are disposed in a virtual plane for receiving light incident from a field of view to be captured, wherein said first and second photodiodes work together as one pixel;

a first micro-lens provided over said first photodiode for collecting the light incident on said first photodiode; and a second micro-lens provided over said second photodiode for collecting the light incident on said second photodiode, said second micro-lens having a curvature smaller than that of said first micro-lens, an optical shielding film having a first opening located above said first photodiode and a second opening located above said second photodiode associated with said second micro-lens, said second opening being smaller than said first opening and said smaller curvature second micro-lens being located over said smaller second opening;

a first in-layer lens provided between said first opening and said first micro-lens for further collecting the light collected by said first micro-lens on said first photodiode; and a second in-layer lens provided between said second opening and said second micro-lens for further collecting the light collected by said second micro-lens on said second photodiode, said second in-layer lens having a curvature smaller than that of said first in-layer lens, wherein said second micro-lens curvature is smaller than said first micro-lens curvature by an amount determined based on sensitivities of said first and second photodiodes within said one pixel, said smaller curvature being such that an image circle formed by collected incident light for said second photodiode has its periphery outside said optical shielding film opening located above said second photodiode.

17. The solid-state image sensor in accordance with claim 16, wherein an amount by which said curvature is smaller is determined based on a sensitivity difference between said first and said second photodiodes.

18. The solid-state image sensor in accordance with claim 16, wherein an amount by which said curvature is smaller is determined such that said image sensor maintains a sensitivity ratio between said first and said second photodiodes.

* * * * *